United States Patent
Gudmundsson et al.

(10) Patent No.: US 6,889,101 B1
(45) Date of Patent: May 3, 2005

(54) APPARATUS FOR COMPUTER-AIDED DESIGN OF A PRODUCT OR PROCESS

(75) Inventors: Thorkell Gudmundsson, San Jose, CA (US); Mark Erickson, San Bruno, CA (US); Sunil C. Shah, Los Altos, CA (US)

(73) Assignee: Tokyo Electron Limited, Tokyo (JP)

( * ) Notice: Subject to any disclaimer, the term of this patent is extended or adjusted under 35 U.S.C. 154(b) by 1103 days.

(21) Appl. No.: 09/707,490

(22) Filed: Nov. 6, 2000

Related U.S. Application Data

(63) Continuation-in-part of application No. 09/199,708, filed on Nov. 24, 1998, now Pat. No. 6,289,255, which is a continuation of application No. 08/977,781, filed on Nov. 25, 1997, now Pat. No. 5,880,959.
(60) Provisional application No. 60/186,832, filed on Mar. 3, 2000.

(51) Int. Cl.[7] ............................................. G06F 19/00
(52) U.S. Cl. ........................................ 700/97; 700/105
(58) Field of Search .................... 700/97, 98, 103–105, 700/121; 716/9, 10; 703/1

(56) References Cited

U.S. PATENT DOCUMENTS

| | | | | |
|---|---|---|---|---|
| 5,552,995 A | * | 9/1996 | Sebastian ...................... | 700/97 |
| 5,880,959 A | | 3/1999 | Shah et al. .................... | 700/97 |
| 6,393,331 B1 | * | 5/2002 | Chetta et al. .................. | 700/97 |
| 6,625,507 B1 | * | 9/2003 | Dickerson et al. ............. | 700/97 |

* cited by examiner

*Primary Examiner*—Leo Picard
*Assistant Examiner*—Steven R. Garland
(74) *Attorney, Agent, or Firm*—Wood, Herron & Evans, L.L.P.

(57) ABSTRACT

An apparatus for computer-aided design of a product or process is described. The apparatus includes a template module for storing a plurality of tasks and a plurality of rules for designing the product. The apparatus further includes a processing module coupled to the template module and being configured by the plurality of rules, for executing the plurality of tasks.

85 Claims, 9 Drawing Sheets

APPARATUS FOR COMPUTER-AIDED DESIGN OF A PRODUCT OR PROCESS

REFERENCE TO RELATED APPLICATIONS

This application is a continuation-in-part of application Ser. No. 09/199,708, titled "Method for Computer-Aided Design of a Product or Process," filed on Nov. 24, 1998, now U.S. Pat. No. 6,289,255; which is a continuation of application Ser. No. 08/977,781, filed Nov. 25, 1997, now U.S. Pat. No. 5,880,959, titled "Method for Computer-Aided Design of a Product or Process," issued on Mar. 9, 1999.

This application also claims the benefit of U.S. Provisional Application No. 60/186,832, filed on Mar. 3, 2000.

FIELD OF THE INVENTION

The present invention relates generally to system design and control techniques, and, more particularly, to an apparatus for computer-aided design of a product or process.

BACKGROUND OF THE INVENTION

The design and manufacture of new products is becoming an increasingly complex activity because users of such products are demanding an increased number of high performance features that require advanced signal processing and feedback control. Many industries today also rely on complex processes to manufacture a product that also require advanced signal processing and feedback control.

Designing advanced signal processing and control products for dynamic systems is a complicated process. The process involves complex computational algorithms, a complex sequence of design tasks, difficult decision-making, data management, data visualization, and project planning.

This situation presents a challenge for those designing products and control systems, in part because the standard methodologies and apparatuses for design of products and control systems are inadequate in several respects. Many modern products and manufacturing processes are too complex and cannot be satisfactorily controlled by standard control methods and apparatuses. Typical prior (or standard) design methods and apparatuses are linear plans that do not provide alternatives required by the uncertainty of outcomes of computations and tests, and then permit planning based on resource utilization. Also, these prior methods and apparatuses do not incorporate actual experienced results of process execution and adjust projections accordingly.

It is difficult, if not impossible, to achieve satisfactory results using prior methods and apparatuses. There are many problems in applying such methods and apparatuses to complicated manufacturing processes or control of behavior of high performance products.

Prior methods and apparatuses implemented in design tools are not effective for several reasons. For example, prior design tools typically automate linear fragments of the design activity. Results of design steps are thus unknown or uncertain before the steps are actually carried out. For instance compute time, computational errors, and exceptions, and results of physical tests cannot be known in advance to aid in decision making. These prior tools require a user to make a large number of complex decisions that depend on results of many previous steps. This is a disadvantage because the user must usually possess specific knowledge or skills in order to properly use the information gained from execution of previous steps. It is a further disadvantage because intelligent decisions can only be made and incorporated after waiting for execution of design steps. No problem-specific guidance is available from prior tools for projecting with any accuracy what the results of design steps will be.

Prior design steps can become infeasible or highly optimal because of a user decision made many steps back. Prior design tools cannot help the user see future implications of current decisions. For these reasons, with prior tools, the user must learn by problem-specific experience, over a long period of time, to resolve unknowns and dependencies across design steps.

Effective execution of this process requires expertise in signal processing and/or control theory, in-depth knowledge about the characteristics of the system to be compensated through the product, and awareness of cost-benefit tradeoffs at different stages of the design. Meeting these requirements simultaneously becomes a difficult task.

This problem is further exacerbated by a current division and separation of skill sets among those involved in the design process. For instance, control experts often do not have an in-depth knowledge of the process they are seeking to control. In addition, the proprietary nature of the processes often does not allow for acquisition of an in-depth knowledge of the process. On the other hand, process experts may know conventional control methods but do not know advanced control methods. Existing control design tools are designed for control experts, but are not suitable for process experts.

Experienced control scientists have found ways to sidestep or solve these problems in specific cases. Significant shortcomings still surface, however, when less experienced control designers or team members from other disciplines apply existing software tools to manufacturing and design problems. Consequently, current tools are inadequate for widespread use.

Most existing software design tools simply automate fragments of standard design methods. In general, the tools are ineffective when applied to control of manufacturing processes for the reasons described above.

Advanced signal processing and control design is typically done with the help of computational tools, such as Matlab®, available from Mathworks, Inc., Natick, Mass., with its associated toolboxes. The Matlab® environment provides a collection of functions to a user for solving certain types of tasks. These functions are not linked in a unified environment and using them requires a high level of expertise in compensator theory. At the same time, these functions do not provide integrated planning or decision support, task scheduling, or data management.

SUMMARY OF THE INVENTION

An apparatus for computer-aided design of a product or process is described. The apparatus includes a template module for storing a plurality of tasks and a plurality of rules for designing the product. The apparatus further includes a processing module coupled to the template module and being configured by the plurality of rules, for executing the plurality of tasks.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings in which.

DETAILED DESCRIPTION

Figure 1:
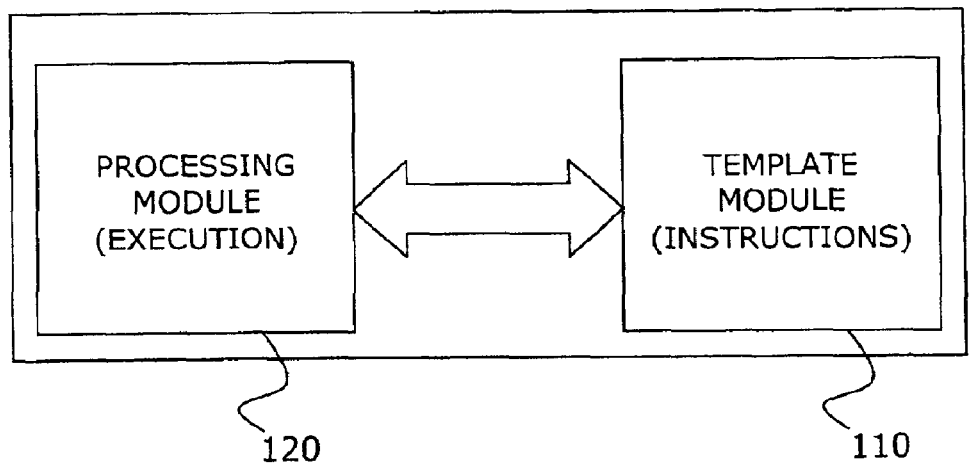
FIG. 1 is a block diagram of one embodiment of an apparatus for computer-aided design of a product or process.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical and other changes may be made without departing from the scope of the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention can be implemented by an apparatus for performing the operations herein. This apparatus may be specially constructed for the required purposes, or it may comprise a general purpose computer, selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required operations. For example, any of the operations of the apparatus according to the present invention can be implemented in hard-wired circuitry, by programming a general purpose processor or by any combination of hardware and software. One of skill in the art will immediately appreciate that the invention can be practiced with computer system configurations other than those described below, including hand-held devices, multiprocessor systems, microprocessor-based or programmable consumer electronics, network PCs, minicomputers, mainframe computers, and the like. The invention can also be practiced in distributed computing environments where tasks are performed by remote processing devices that are linked through a communications network. The required structure for a variety of these systems will appear from the description below.

The operations of the apparatus of the invention may be implemented using computer software. If written in a programming language conforming to a recognized standard, sequences of instructions designed to implement the operations can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application . . . ), as taking an action or causing a result. Such expressions are merely a shorthand way of saying that execution of the software by a computer causes the processor of the computer to perform an action or produce a result.

An apparatus for designing a product or process is described. The apparatus may be used for any product design flow or sequence of tasks. The apparatus integrates a computational environment, real-time planning environment, user presentation, design flow, task scheduling, execution, and data management with computer-encoded design expertise. Additionally, the apparatus provides rules for formulating a design flow and creating a template for a specific problem. Finally, the apparatus operates in an environment that is familiar to the design engineer and which allows rapid development and customization.

FIG. 1 is a block diagram of one embodiment of an apparatus for computer-aided design of a product or process. As illustrated in FIG. 1, in one embodiment, design apparatus 100 includes a template module 110 and a processing module 120, coupled to the template module 110. Processing module 120 is responsible for the execution procedures of the apparatus.

Figure 2:
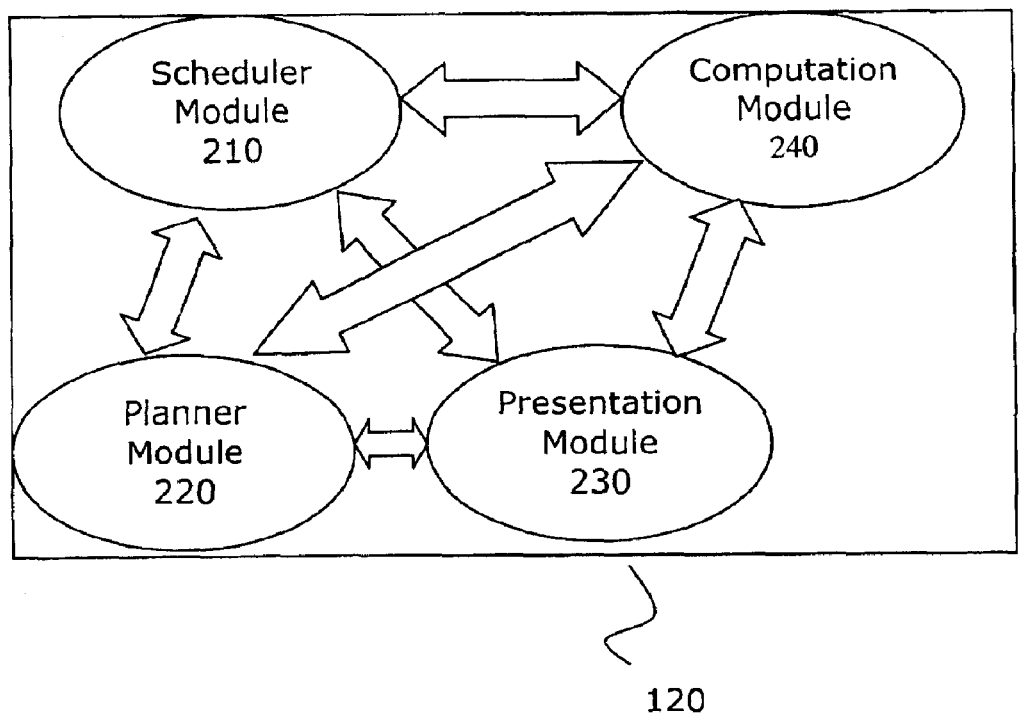
FIG. 2 is a block diagram of one embodiment of a processing module within the apparatus.

FIG. 2 is a block diagram of one embodiment of a processing module within the apparatus. According to one embodiment illustrated in FIG. 2, processing module 120 includes a scheduler module 210, a planner module 220, a presentation module 230, and a computation module 240. In this embodiment, all modules interact directly with each other. However, it should be noted that it is not necessary for each module to directly interact with every other module listed above and that various combinations of interactions may be used depending upon the particular product or process being designed.

In one embodiment, scheduler module 210 runs the entire design process, using a Matlab® environment, or a similar environment. Scheduler module 210 operates using a set of instructions provided by template module 110 shown in FIG. 1. Scheduler module 210 may perform one or more of the following functions, either individually or simultaneously: command interpretation, task scheduling, algorithm execution, data management, and/or presentation. Scheduler module 210 is supported by planner module 220, which provides guidance and planning support to the scheduler module 210.

In one embodiment, scheduler module 210 manages the execution tasks of the design apparatus of the present invention. Scheduler module 210 incorporates multiple functions, for example initializing a project (i.e., the product or process to be designed), invoking the correct task at each point in the design, managing the data between tasks and between design sessions, managing interaction with the planner module 220, managing a main screen display, tracking the progress of the project, and planning the remainder of the project.

In one embodiment, scheduler module 210 organizes data in three categories: persistent data, transient data, and algorithm data. Transient data is data that is created and used with a single task. Persistent data is data that is created by the design apparatus itself, is stored in a data file between sessions, and is recovered when a session is continued after a break. Algorithm data is data that is confined to individual algorithms and is not accessible elsewhere.

Figure 4:
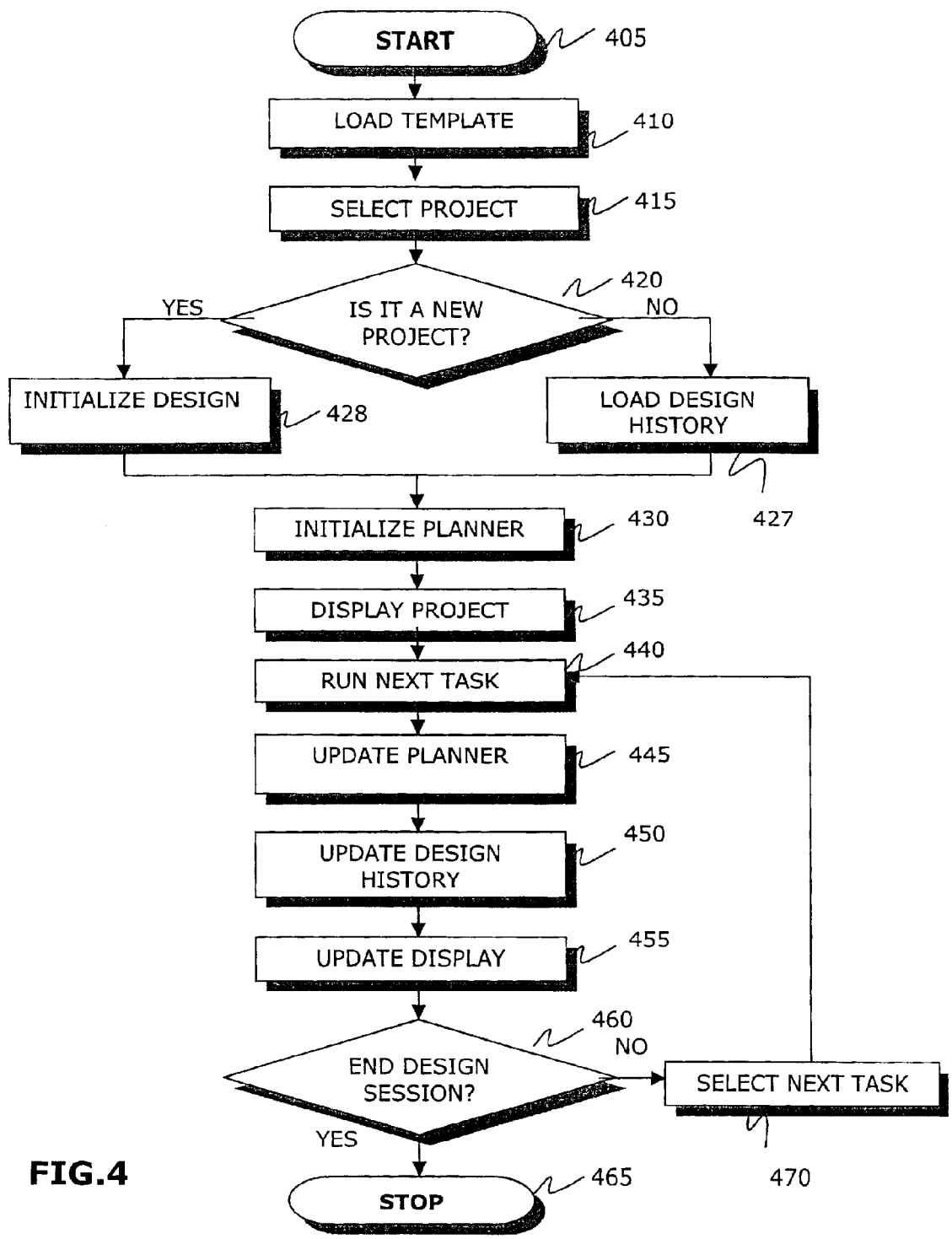
FIG. 4 is a flow diagram of one embodiment of a process managed by a scheduler module within the processing module of the apparatus.

FIG. 4 is a flow diagram of one embodiment of a process managed by a sheduler module within the processing module of the apparatus. It should be noted that the operations managed by scheduler module 210 and illustrated in FIG. 4 may be organized in other equivalent manners and that the flow illustrated is meant merely to be exemplary.

As illustrated in FIG. 4, the process starts at processing block 405. At processing block 410, starting instructions are loaded from the template module 110, including a design flow. A design flow is specified in the template module 110 as a sequence of design tasks. Each design task has a set of successor design tasks that may be enabled or disabled based on the state of the design at each time. The design tasks execute individual algorithms as needed, obtain data from the scheduler module 210 or from a user, generate data for the scheduler module or user, and present their results via the presentation module 230. The design tasks also interact with the planner module 220 for decision guidance and task planning.

At processing block 415, a project to be designed is selected. At processing block 420, a decision is made whether the project selected is a new project or a project that has already been started but for one reason or another the design was stopped before completion. If the project selected is a new project, then the design is initialized, at processing block 428. In one embodiment, initialization of the design includes selection of initial design parameters. If the project is new, in one embodiment of the present invention, the template module 110 provides persistent data that may be used for initialization to the scheduler module 210.

Otherwise, if the project is not new, the design history of the project is loaded, at processing block 427. If the project is not new, in one embodiment of the present invention, the template module 110 provides the scheduler module 210 with the persistent data that was stored when the last session of the design plan for that particular project stopped.

At processing block 430, the planner module 220 is initialized. In one embodiment, in order to initialize the planner module 220, a set of initial parameters for the planner module 220 are selected. As the design of the project progresses, the selected set of initial parameters for the planner module 220 may change. The planner module 220 is described in greater detail below.

Next, at processing block 435, the project is displayed for the user using presentation module 230. The presentation module 230 is described in greater detail below.

At processing block 440, the next design task is run using the task details and algorithms 330 from the template module 110. In one embodiment, the next design task may be a first task to be run after initialization, for example if it is determined that this is a new project. Alternatively, the next design task may be a task subsequent to a last task stored in the design history, for example if the particular project was stopped at one time and the design apparatus is beginning where the project had last been stopped.

Each task specifies a unit operation in the overall design process and each task is usually focused around a single user interaction. However, the task may require any number of computational operations. It should be noted that the task being run may utilize the presentation module 230 and the computation module 240. Some tasks may also involve decision making by the user. In these instances, the user may refer to the planner module 220 to provide some guidance in making the decisions. For example, the user may look to the planner module 220 for cost estimates of making a certain decision or the progress assessment of the overall design if a particular decision is made.

At processing block 445, the planner module 220 is updated. In one embodiment, the template module 110 contains guidance information and planning information needed to update the planner module 220. If the planner module is the Real-Time Planner described above, which utilizes a Bayesian Belief Network computational engine, then the guidance and planning rules are provided in the form of one or more Bayesian Belief Networks, each representing a portion of the design flow.

Updating the planner module 220 enables the design apparatus to keep track of the design as it progresses. It also enables the planner module 220 to use the latest available information to provide continuously updated predictions of the effects that the completion of the design task and any decisions that were made may have on the future of the design.

Next, at processing block 450, the design history of the project is updated to contain the design task that was just run.

At processing block 455, the display is updated using the presentation module 230 and the new parameters of the project are displayed for the user. The information available at the completion of each task is used by the scheduler module 210 to update the predictions of the remaining tasks, update the assessment of the state of the design, as well as selecting the next task in the sequence.

At processing block 460, a decision is made whether the design session must end and no more tasks are to be performed or if additional design tasks need to be run. In one embodiment, if the design session ends, the procedure stops at processing block 465. The design session may end whether or not the design has been completed and the objective has been met. If the objective has not been met, the design may be continued in a subsequent session and blocks 427 through 460 may be repeated.

Otherwise, if the design session does not end, a new task is selected at processing block 470 and blocks 440 through 460 are repeated. In one embodiment, the template module 110 contains information pertaining to design tasks and possible future tasks. For example, such information may be contained in the design flow within the template module 110.

In one embodiment, the planner module 220 is coupled to the scheduler module 210. The planner module may provide functions such as: decision guidance, project planning and tracking support, and probabilistic assessment of the state of the design process. It should be noted that it is not necessary for planner module 220 to provide all the features listed above and that various combinations of features may be used depending upon the particular product or process being designed. An example of a planner module 220 is described in detail in U.S. patent application Ser. No. 09/345,172, filed Jun. 30, 1999, entitled "Real-Time Planner for Design," to Sunil C. Shah, Pradeep Pandey, Thorkell Gudmundsson, and Mark Erickson, and assigned to the assignee herein. Alternatively, other methods and tools may be provided to make the required complex decisions.

In one embodiment, the planner module 220 provides decision guidance by quantifying the utility of making a certain decision and/or recommending the best decision at a decision point. In order to accomplish this, the planner module 220 quantifies the utility of making a certain decision. The planner module may recommend the best decision at a decision point and/or may rank the alternative decisions based upon the quantification of the decisions.

The planner module 220 may also provide project tracking and planning. Planner module 220 performs this function by tracking any completed tasks and using the state of the design to predict what tasks are needed to complete the design and in what sequence.

Additionally, the planner module 220 may provide probabilistic assessment by collecting information as the design progresses. In one embodiment of the present invention, the rules and/or instructions that the planner module 220 uses for quantification, prediction, and/or assessment of the state of the design may be provided in the template module 110. The planner module 220 may use the presentation module 230 to relay this information to the user.

Figure 5:
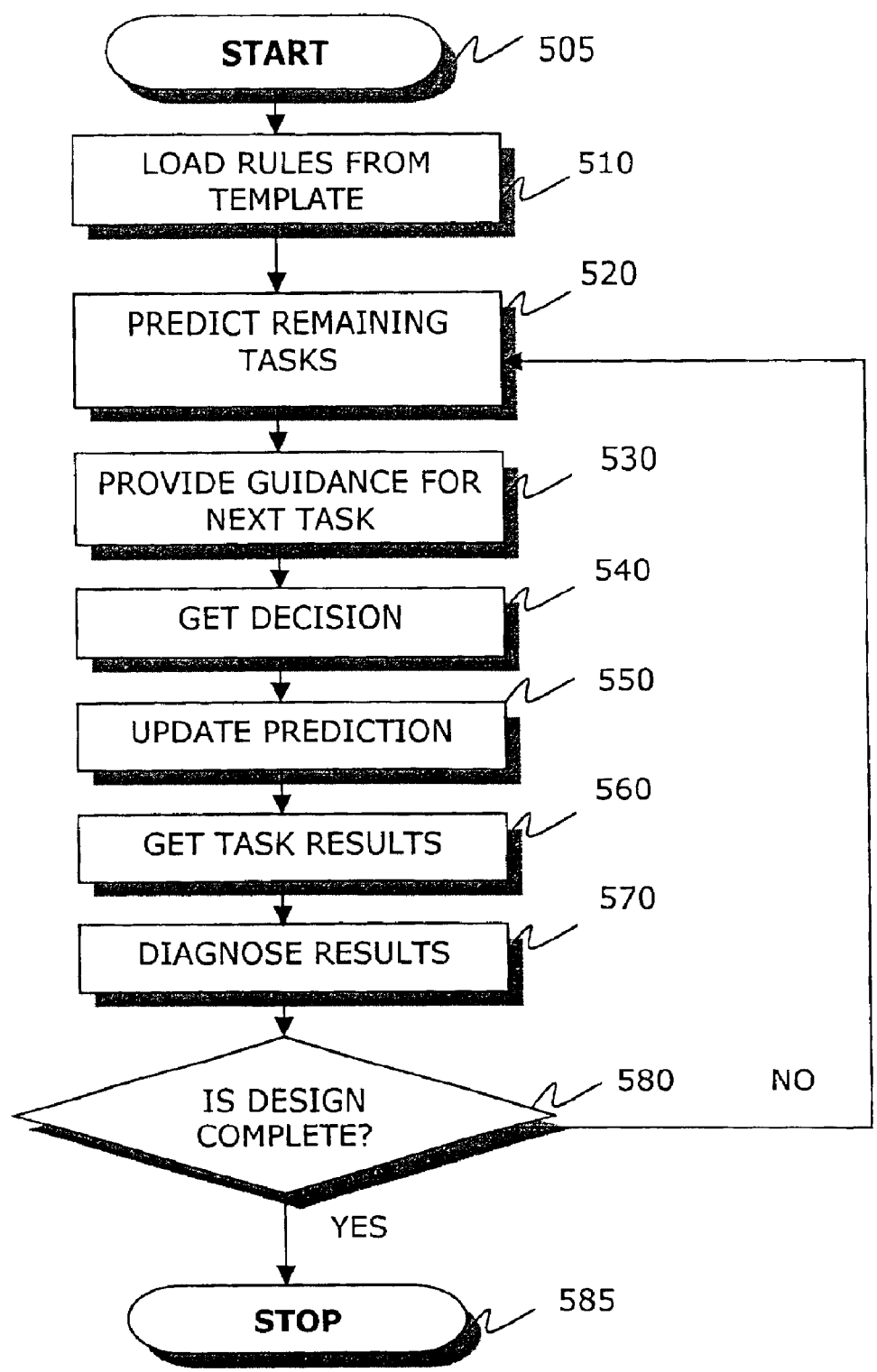
FIG. 5 is a flow diagram of one embodiment of a process managed by a planner module within the processing module of the apparatus.

FIG. 5 is a flow diagram of one embodiment of a process managed by a planner module within the processing module of the apparatus. The process starts at processing block 505 when the scheduler module 210 initializes the planner module 220, as described above at processing block 430 of FIG. 4. As illustrated in FIG. 5, at processing block 510, the planner module 220 loads the planning and guidance rules 320 from the template 110. The planner module 220 then predicts the remaining tasks, i.e., determines the plan for completing the design, at processing block 520.

Next, at processing block 530, the planner module provides guidance for the next decision that needs to be made. At processing block 540, the planner module 220 obtains the actual decision made by the user, and subsequently uses this information to update the prediction (or plan) accordingly at processing block 550. After the task has been completed, at processing block 560, the planner module obtains the results of the performance of the design task, and then diagnoses those results at processing block 570.

At processing block 580, a determination of whether or not the design is complete is made. In one embodiment, if the design is complete, then the planner module 220 stops at processing block 585. Otherwise, if the design is not complete, the planner module 220 updates the plan by predicting the remaining tasks, thus processing blocks 520 through 580 being repeated. It is to be understood that planner module 220 may also stop if the design is not complete and may restart in a subsequent session.

Referring back to FIG. 2, in one embodiment, presentation module 230 is coupled to the planner module 220. Presentation module 230 may display the progress of the design, the set of tasks that are expected or needed to complete the design, and incurred and expected project costs. It should be noted that it is not necessary for presentation module 230 to display all of the objectives listed above and that various combinations of objectives may be displayed depending upon the particular product or process being designed. It should also be noted that the presentation module 230 may display any of the above objectives either singularly or simultaneously depending upon the desire of the user.

In another embodiment, the presentation module 230 may also display an assessment of the current quality of the design. In yet another embodiment, the presentation module 230 may present guidance for making design decisions, display instructions for performing each task, and/or display the results of completed tasks. An example of a presentation module is described in detail in U.S. patent application Ser. No. 09/346,401, filed Jun. 30, 1999, entitled "A Method and Apparatus for Presentation of Integrated Project Planning and Computer Aided Design," to Thorkell T. Gudmundsson, John M. Cooney, Sunil, C. Shah, and Mark A. Erickson, and assigned to the assignee herein. Alternatively, other tools and methods may be used to display the desired progress information and/or results.

Figure 6:
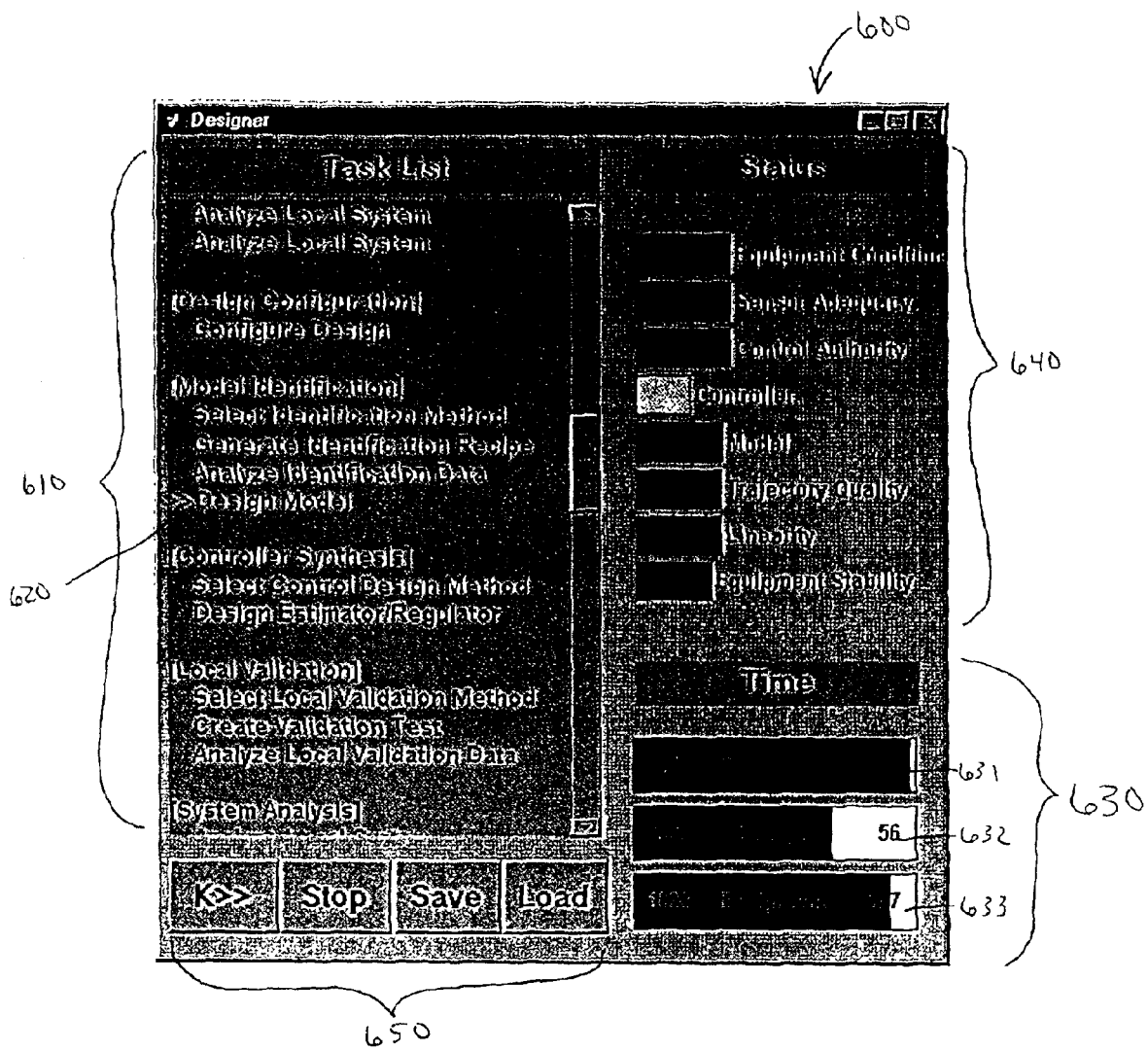
FIG. 6 illustrates an exemplary window for a display presented by a presentation module within the processing module of the apparatus.

FIG. 6 illustrates an exemplary window for a display presented by a presentation module within the processing module of the apparatus. As illustrated in FIG. 6, presentation module 230 uses a window 600 to display the design progress, design plan, and design status of the particular project. Window 600 of FIG. 6 is updated periodically by the scheduler module 210, as described above at processing block 455 of FIG. 4. It should be noted that the display presented by presentation module 230 in window 600 is merely meant to be exemplary and that other information may also be displayed depending upon the particular project and needs of the particular user.

In the embodiment illustrated in FIG. 6, window 600 displays a task list 610 which is a combined list of completed tasks and tasks expected to be needed to complete the design. As illustrated in this example, the current task is indicated by a double caret 620. In this particular embodiment, window 600 also displays the cost incurred and expected, in the form of different time measurements shown as element 630. For example, the cost factors of this particular embodiment are a compute time 631, a design time 632, and an equipment time 633. It should be noted that the cost factors illustrated in FIG. 6 are meant merely to be exemplary, that other cost factors may be used, and that the cost factors may be quantified in other manners rather than time, for example currency, manpower, or other resources.

As illustrated in FIG. 6, in one embodiment, window 600 further displays the status of the current design project in an element 640. In one embodiment, window 600 displays the current quality of the design and the design conditions using multiple bars. The length of the bars indicate the current estimate of the quality of a particular condition. For example, in the case of a controller, a short bar indicates that the performance of the controller is estimated as insufficient. Additionally, window 600 may display interactive buttons 650 for controlling the execution of the design apparatus. It should be noted that the buttons 650 for controlling the execution of the design apparatus may include various control operations, and that the buttons illustrated in FIG. 6: K>>, Stop, Save, and Load, are merely examples used for illustrative purposes only.

Figure 7:
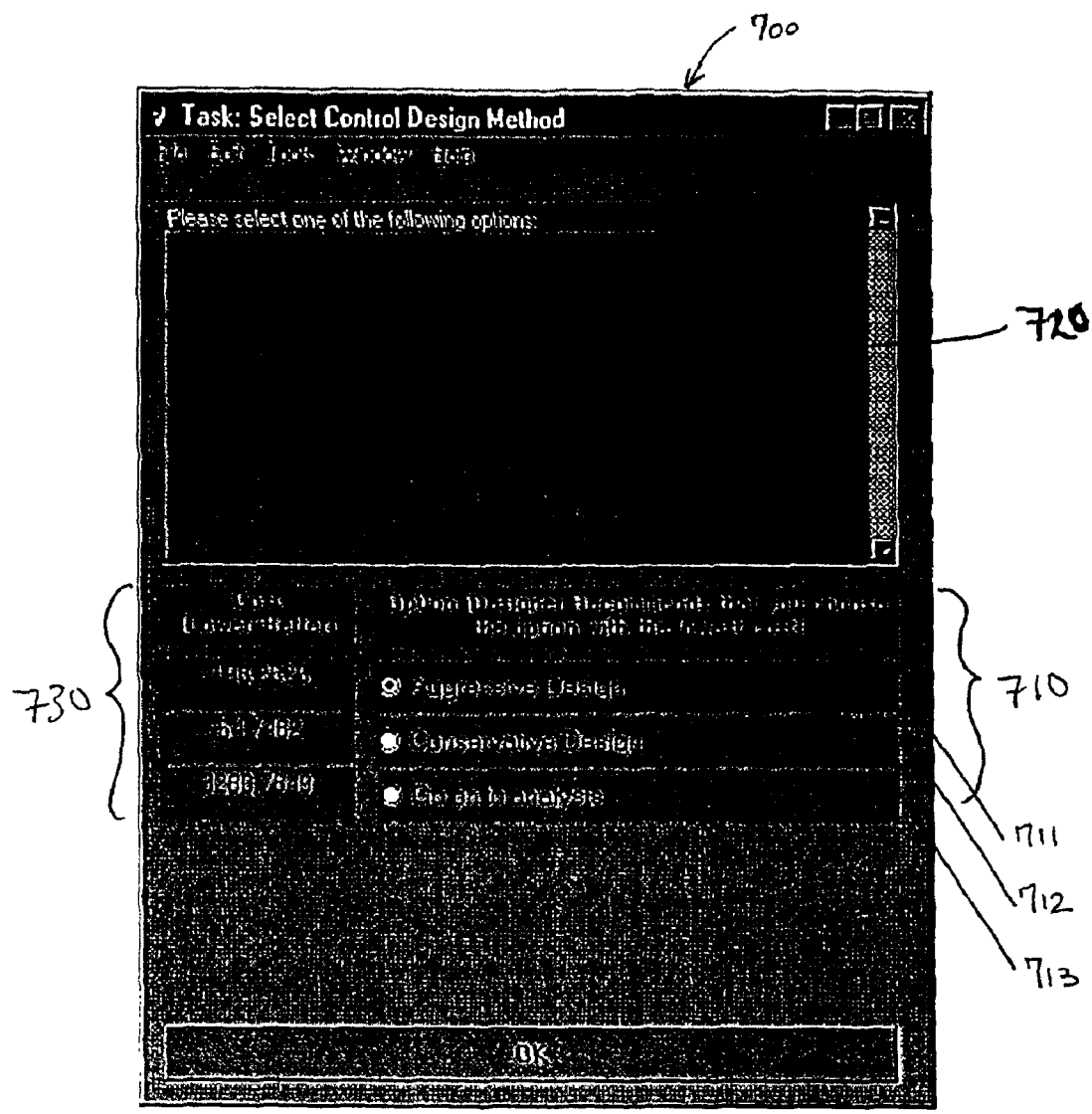
FIG. 7 illustrates an exemplary window for a display that the presentation module may use to present a user with guidance for a design decision.

FIG. 7 illustrates an exemplary window for a display that the presentation module may use to present a user with guidance for a design decision. As shown in FIG. 7, in one embodiment, window 700 displays options 710, which embody the choices available to the user. In this embodiment, options 710 include: an option for aggressive design 711, an option for conservative design 712, and an option to go on to perform more analysis 713.

As illustrated in FIG. 7, window 700 also displays a box 720 containing instructions for each option that can be displayed. In one embodiment, presentation module 230 uses window 700 to display a cost value 730 assigned to each option 710. The cost value 730 for each option 710 is obtained from the planner module 220. In this embodiment, the option recommended by the design apparatus is the one with the lowest cost, however, the user can override this recommendation and select another option.

Referring back to FIG. 2, computation module 240 is coupled to the scheduler module 210 and is accessed by the scheduler module 210 when necessary. In one embodiment, the computation module 240 performs design computations. In alternate embodiments, the computation module 240 may perform any number of functions such as: simulations, data analysis, and/or file handling. It should be noted that the computation module 240 may perform any number of the functions described above, either individually or in combination, depending upon the particular product or process being designed.

The computation module 240 may further include utilities such as: utilities for manipulating data files; utilities for performing basic linear algebra computations; utilities for performing simulations; utilities for performing data analysis; displays for simultaneously displaying results, displaying guidance, and prompting for a decision; and/or displays for loading and saving data files.

If provided in a particular embodiment, these utilities may be used by the design tasks as needed. The utilities may also be combined in variations depending upon the requirements of the particular product or process being designed. The presentation module 230 and computation module 240 may be used by the tasks as needed.

Figure 3:
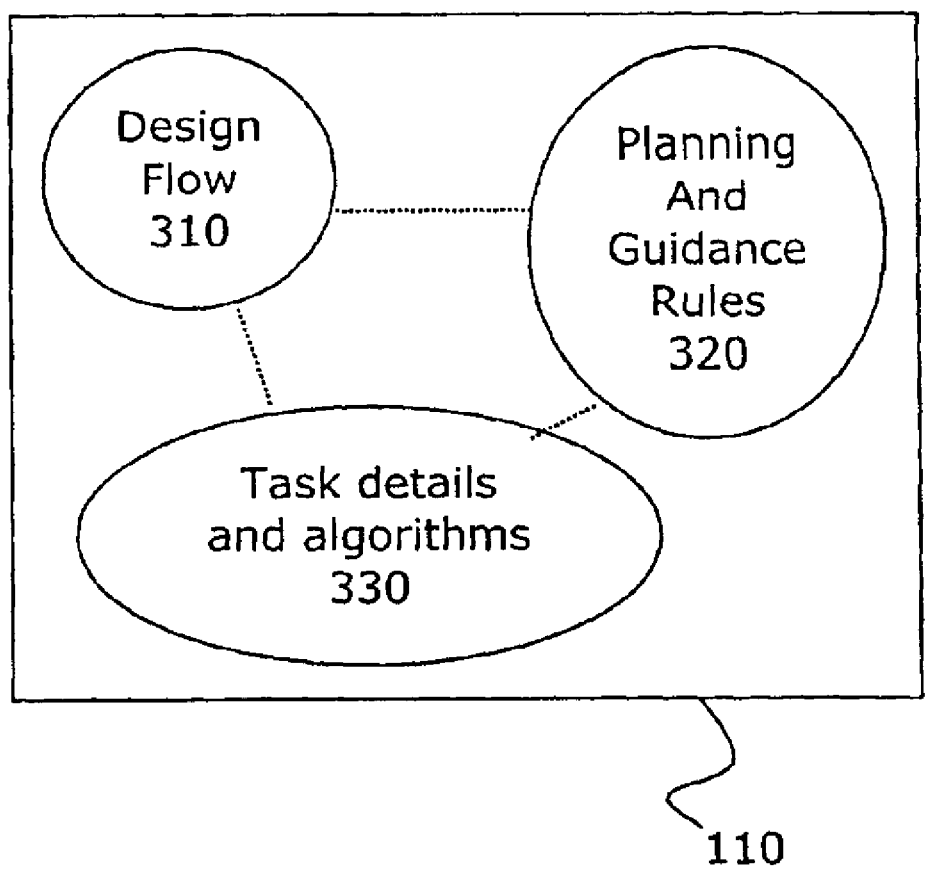
FIG. 3 is a block diagram of one embodiment of a template module within the apparatus.

FIG. 3 is a block diagram of one embodiment of a template module within the apparatus. In one embodiment illustrated in FIG. 3, template module 110 incorporates the expertise necessary to properly execute the design. In one embodiment, this expertise is computer-encoded in the form of instructions and rules that the processing module 120 follows during execution. For example, in one embodiment, the expertise is arranged into three categories: a design flow 310, planning and guidance rules 320, and task details and algorithms 330. It should be noted that the template module 110 may be specific to a certain type of design method or to a certain type of application, or may apply to different applications. In other embodiments, the template module 110 may also include instructions and rules for the planner module 220.

In one embodiment, template module 110 includes rules (template rules) that govern the implementation of the processing module 120 and ensure that the template module 110 is compatible with the processing module 120. The template rules may include rules for: specifying task sequence; specifying task information; specifying guidance and planning; starting and finishing a task; managing data within a task; presentation and user interaction; specifying a task's interaction with the planner module 220; or a combination of any of the above rules.

The instructions and rules contained in the template module 110 are specific to the particular design problem that the apparatus is applied to. Template module 110 is used to encode the design expertise needed to complete the design of the product or process in a set of instructions and rules that the processing module 120 can interpret. Template module 110 may simultaneously include expertise from multiple sources, such as scientists, equipment specialists, and manufacturing specialists.

An example of one embodiment of a template for one particular product design will be described. The product to be designed in the following example is a generic controller. The template instructions and rules will not be described in detail, but rather illustrated through flow diagrams and block diagrams. It should be noted that the following example of a generic controller is not meant to be limiting on the present invention and that the design apparatus of the present invention may be used to design various products or processes.

Figure 8:
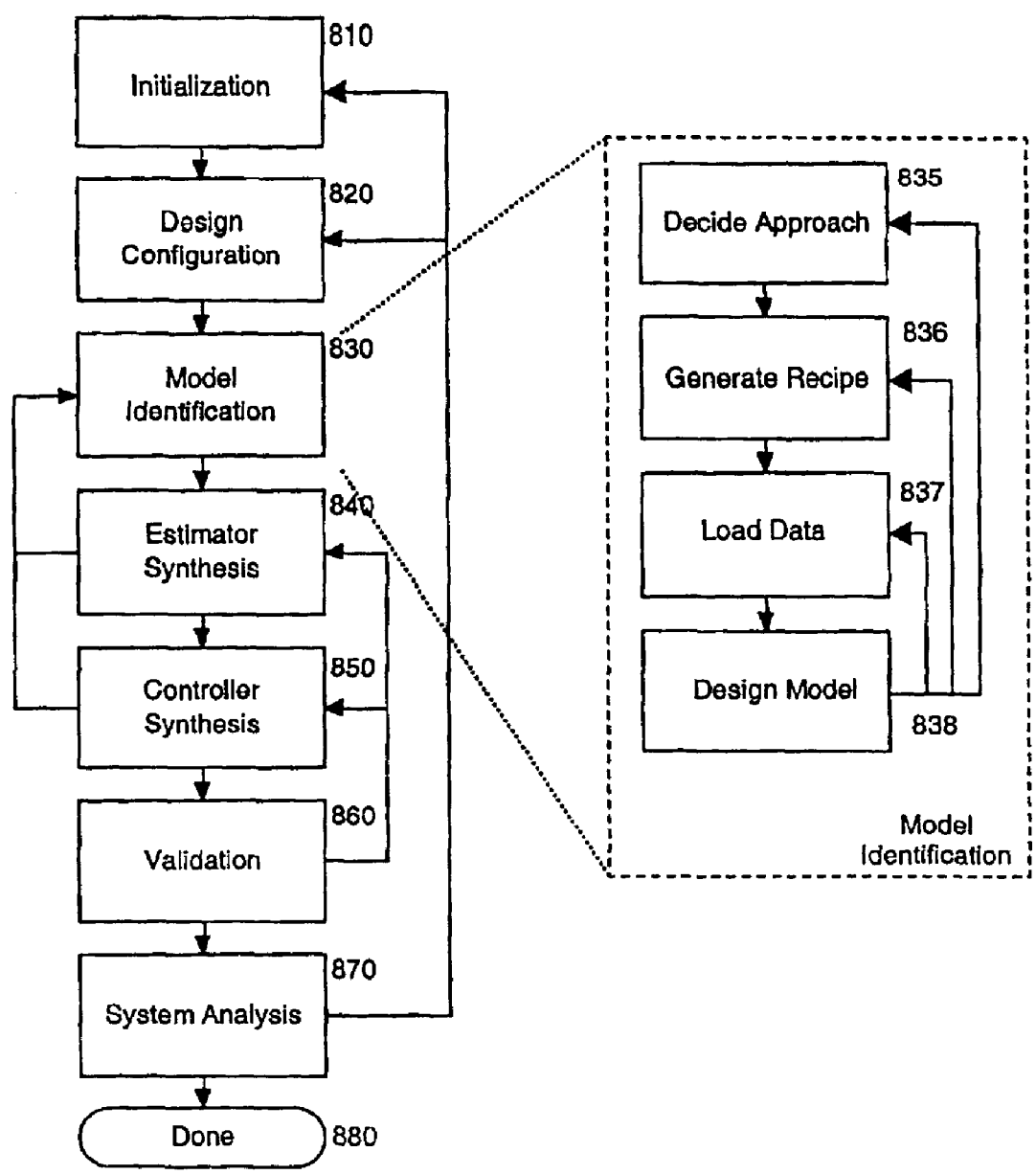
FIG. 8 is a flow diagram of one embodiment of a design flow within the template module of the apparatus.

FIG. 8 is a flow diagram of one embodiment of a design flow within the template module of the apparatus. Each individual block 810–880 represents a series of tasks to be performed. One such block (block 830) is expanded to show the tasks within that series.

As illustrated in FIG. 8, at processing block 810, the design is initialized. Next, the first design iteration is configured at processing block 820. A model is identified at block 830. An estimator is synthesized and a controller is synthesized at blocks 840 and 850, respectively. The design is validated experimentally at block 860 and the current status of the design is analyzed at block 870. The sequence 820 through 870 is repeated until the design is completed. Once the system analysis determines that the design is completed then the design flow stops at block 880.

The expansion of block 830 illustrates the underlying tasks required to perform model identification. As shown, model identification block 830 includes four tasks: deciding the identification approach (block 835); generating an experimental recipe (block 836); loading the resulting data (block 837); and designing the model (block 838). It should be noted that the other blocks 810–880 may also be expanded to show the underlying tasks required for each block, however only one block is expanded here for illustrative purposes.

Figure 9:
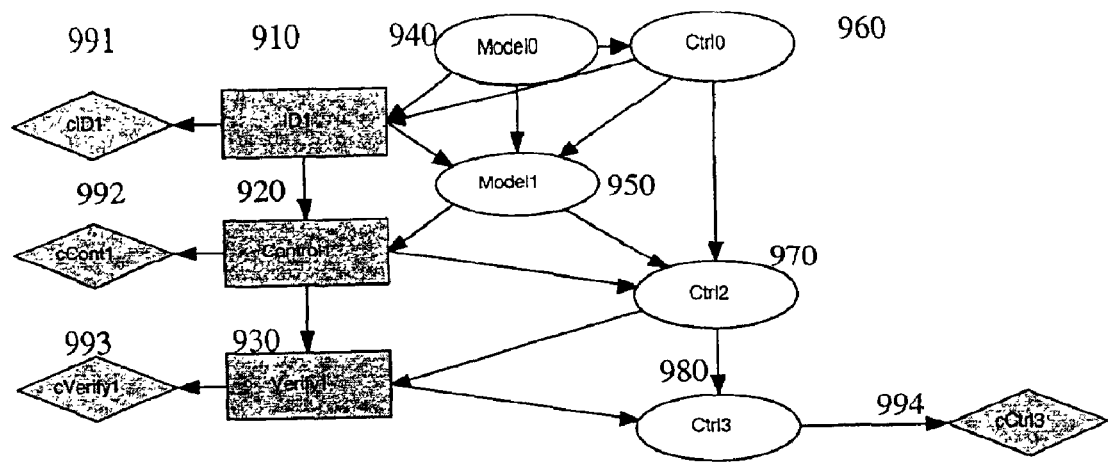
FIG. 9 is a diagram of one embodiment of planning and guidance rules within the template module.

Referring back to FIG. 3, template 110 includes planning and guidance rules 320. FIG. 9 is a diagram of one embodiment of planning and guidance rules within the template module. As illustrated in FIG. 9, in one embodiment, the planning and guidance rules 320 are encoded in a Bayesian Belief Network. In this embodiment, the set of decisions to be made at each design iteration are encoded in blocks ID1 910, Control1 920, and Verify1 930. The status of the design is encoded in blocks Model0 940, Model1 950, Ctrl0 960, Ctrl2 970, and Ctrl3 980. The costs associated with each of the decisions and with the design status are encoded in the blocks cID1 991, cCont1 992, cVerify1 993, and cCtrl3 994, respectively. It should be noted that FIG. 9 is an example of planning and guidance rules encoded in a Bayesian Belief Network. Therefore, the set of decisions, the status, and the costs may be different for different tasks and design projects. In other words, the planning and guidance rules will change depending upon the task to be completed and the design project being undertaken.

Figure 10:
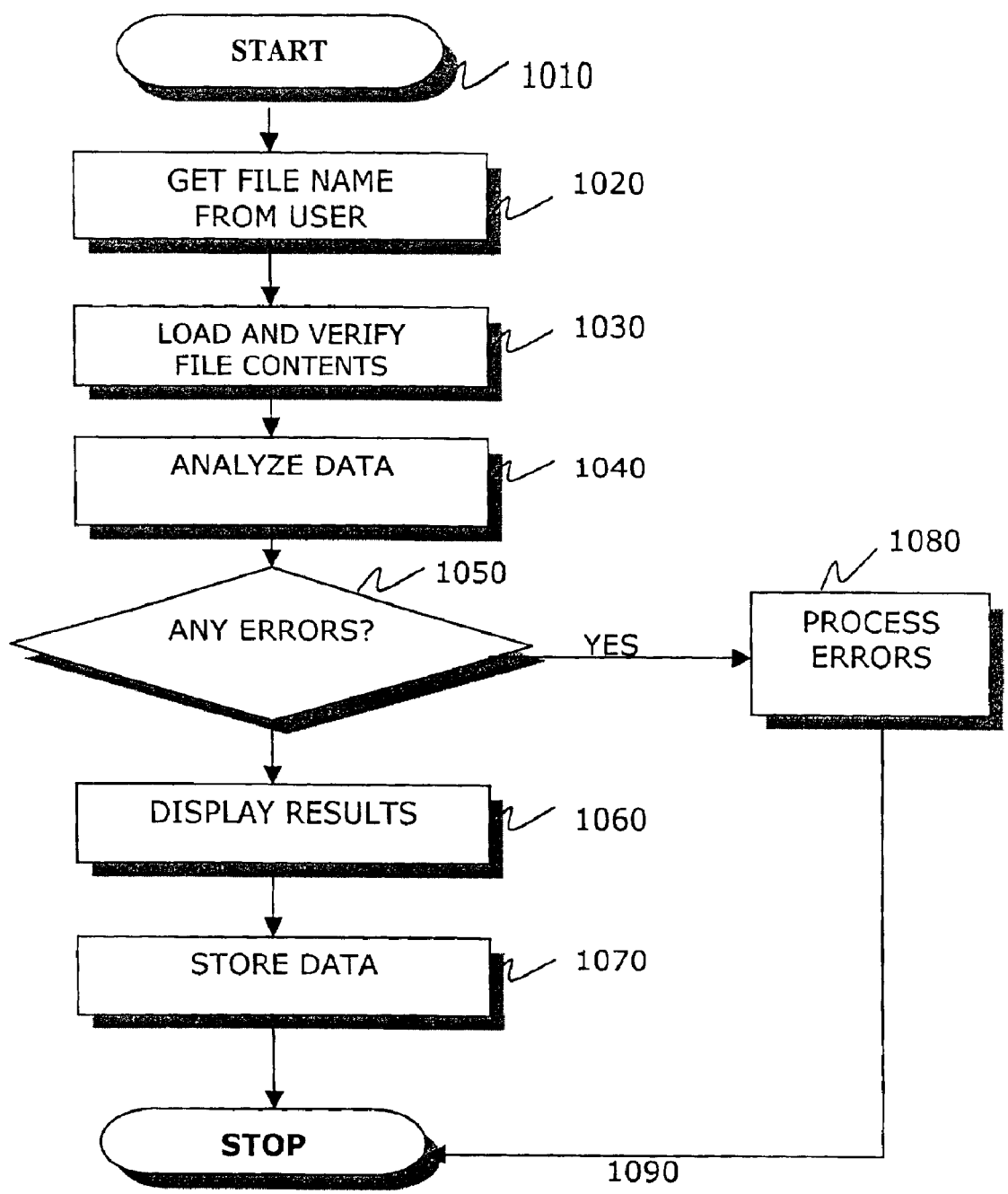
FIG. 10 is a flow diagram of one embodiment of a design flow for a load data task performed by the template module within the apparatus.

Referring back to FIG. 3, template module 110 also includes task details and algorithms 330. The details of each task and the algorithms required by each task 330 vary greatly from task to task. FIG. 10 is a flow diagram of one embodiment of a design flow for a load data task performed by the template module within the apparatus. The "load data" task is described in detail at processing block 837 of FIG. 8. The "load data" task starts at processing block 1010. A file name from the user is obtained at processing block 1020. The task 837 then loads and verifies the correctness of data residing in the file at processing block 1030. Next, data is analyzed at block 1040. For example, data may be analyzed using the computation module 240.

At processing block 1050, a query is made as to whether the file contains any errors. If no errors have been found, then the results are displayed at processing block 1060. Data is subsequently stored for future use at block 1070, and the task completes at block 1090. If errors have been found, then the errors are processed at block 1080 and the task stops at block 1090. In one embodiment, error processing includes displaying of an appropriate error message and requesting regeneration of data or loading of an alternate file. Alternatively, depending on the type and severity of errors, other error processing methods may be used.

It should be noted that the above-described design apparatus of the present invention may utilize methods described in U.S. Pat. No. 5,880,959, entitled "Method for Computer-Aided Design of a Product or Process," to Sunil C. Shah and Pradeep Pandey, and assigned to the assignee herein.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for designing a product, said apparatus comprising:
   a template module for storing a plurality of tasks and a plurality of rules for designing said product; and
   a processing module, coupled to said template module and being configured by said plurality of rules, for executing said plurality of tasks.

2. The apparatus according to claim 1, wherein said template module further comprises at least one rule of said plurality of rules for specifying a sequence of execution for said plurality of tasks.

3. The apparatus according to claim 1, wherein said template module further comprises at least one rule of said plurality of rules for specifying task information for each task of said plurality of tasks.

4. The apparatus according to claim 1, wherein said template module further comprises at least one rule of said plurality of rules for specifying guidance and planning for each task of said plurality of tasks.

5. The apparatus according to claim 4, wherein said at least one rule specifying guidance and planning is encoded in a Bayesian Belief Network.

6. The apparatus according to claim 1, wherein said template module further comprises at least one rule of said plurality of rules for specifying a start event and an end event for each task of said plurality of tasks.

7. The apparatus according to claim 1, wherein said template module further comprises at least one rule of said plurality of rules for managing data within one task of said plurality of tasks.

8. The apparatus according to claim 1, wherein said template module further comprises at least one rule of said plurality of rules for allowing interaction with a user and presenting results to said user.

9. The apparatus according to claim 1, wherein said template module further comprises at least one rule of said plurality of rules for specifying interaction of each task of said plurality of tasks with said processing module.

10. The apparatus according to claim 1, wherein said template module further stores a plurality of task details for each task of said plurality of tasks.

11. The apparatus according to claim 1, wherein said template module further stores a plurality of task operations for each task of said plurality of tasks.

12. The apparatus according to claim 1, wherein said processing module further comprises:
   a scheduler module for monitoring execution of said plurality of tasks; and
   a planner module coupled to said scheduler module for monitoring operation of said scheduler module and said template module.

13. The apparatus according to claim 12, wherein said scheduler module further selects a project incorporating said plurality of tasks and monitors said execution of each task of said plurality of tasks.

14. The apparatus according to claim 13, wherein, while monitoring, said scheduler module further invokes each task of said plurality of tasks, schedules said each task for said execution, determines completion of said each task, and manages data between consecutive tasks of said plurality of tasks.

15. The apparatus according to claim 13, wherein, while selecting, said scheduler module further assigns a set of project parameters to said project, initializes said planner module with a set of planner parameters, and displays said set of project parameters to a user.

16. The apparatus according to claim 15, wherein said set of project parameters includes initial project parameters provided by said user.

17. The apparatus according to claim 15, wherein said scheduler module further updates said set of planner parameters after completion of said each task of said plurality of tasks.

18. The apparatus according to claim 15, wherein said scheduler module further updates said set of project parameters after completion of said each task of said plurality of tasks to obtain a set of updated project parameters, and displays said set of updated project parameters to said user.

19. The apparatus according to claim 12, wherein said planner module further loads at least one planning and guidance rule of said plurality of rules from said template module, determines a sequence of execution for said each task of said plurality of tasks based on said at least one planning and guidance rule, and predicts a decision for each task of said plurality of tasks.

20. The apparatus according to claim 19, wherein said planner module further monitors at least one executed task of said plurality of tasks and updates said decision for said each task of said plurality of tasks remaining to be executed.

21. The apparatus according to claim 20, wherein said planner module further obtains at least one result of said at least one executed task of said plurality of tasks and diagnoses said at least one result.

22. The apparatus according to claim 12, wherein said processing module further comprises:
 a presentation module coupled to each of said scheduler module and said planner module for displaying information to a user; and
 a computation module coupled to each of said presentation module, said scheduler module, and said planner module for performing computations related to said execution of said plurality of tasks.

23. The apparatus according to claim 22, wherein said presentation module further displays a plurality of costs incurred and expected in said execution of each task of said plurality of tasks.

24. The apparatus according to claim 22, wherein said presentation module further displays a plurality of instructions for executing each task of said plurality of tasks.

25. The apparatus according to claim 22, wherein said presentation module further displays results of said plurality of tasks after execution.

26. The apparatus according to claim 22, wherein said computation module further includes a plurality of utilities for manipulating data files within said processing module.

27. The apparatus according to claim 22, wherein said computation module further includes a plurality of utilities for performing said computations.

28. The apparatus according to claim 22, wherein said computation module further includes a plurality of utilities for performing simulations of at least one task of said plurality of tasks within said processing module.

29. The apparatus according to claim 22, wherein said computation module further includes a plurality of utilities for performing data analysis within said processing module.

30. An apparatus for designing a product, said apparatus comprising:
 a template module for storing a plurality of tasks and a plurality of rules for designing said product; and
 a processing module, coupled to said template module and being configured by said plurality of rules, for executing said plurality of tasks;
 said processing module having a scheduler module for monitoring execution of said plurality of tasks, and a planner module coupled to said scheduler module for monitoring operation of said scheduler module and said template module.

31. The apparatus according to claim 30, wherein said template module further comprises at least one rule of said plurality of rules for specifying a sequence of execution for said plurality of tasks.

32. The apparatus according to claim 30, wherein said template module further comprises at least one rule of said plurality of rules for specifying task information for each task of said plurality of tasks.

33. The apparatus according to claim 30, wherein said template module further comprises at least one rule of said plurality of rules for specifying guidance and planning for each task of said plurality of tasks.

34. The apparatus according to claim 33, wherein said at least one rule specifying guidance and planning is encoded in a Bayesian Belief Network.

35. The apparatus according to claim 30, wherein said template module further comprises at least one rule of said plurality of rules for specifying a start event and an end event for each task of said plurality of tasks.

36. The apparatus according to claim 30, wherein said template module further comprises at least one rule of said plurality of rules for managing data within one task of said plurality of tasks.

37. The apparatus according to claim 30, wherein said template module further comprises at least one rule of said plurality of rules for allowing interaction with a user and presenting results to said user.

38. The apparatus according to claim 30, wherein said template module further comprises at least one rule of said plurality of rules for specifying interaction of each task of said plurality of tasks with said processing module.

39. The apparatus according to claim 30, wherein said scheduler module further selects a project incorporating said plurality of tasks and monitors said execution of each task of said plurality of tasks.

40. The apparatus according to claim 39, wherein, while monitoring, said scheduler module further invokes each task of said plurality of tasks, schedules said each task for said execution, determines completion of said each task, and manages data between consecutive tasks of said plurality of tasks.

41. The apparatus according to claim 39, wherein, while selecting, said scheduler module further assigns a set of project parameters to said project, initializes said planner module with a set of planner parameters, and displays said set of project parameters to a user.

42. The apparatus according to claim 41, wherein said set of project parameters includes initial project parameters provided by said user.

43. The apparatus according to claim 41, wherein said scheduler module further updates said set of planner parameters after completion of said each task of said plurality of tasks.

44. The apparatus according to claim 41, wherein said scheduler module further updates said set of project parameters after completion of said each task of said plurality of tasks to obtain a set of updated project parameters, and displays said set of updated project parameters to said user.

45. The apparatus according to claim 30, wherein said planner module further loads at least one planning and guidance rule of said plurality of rules from said template module, determines a sequence of execution for said each task of said plurality of tasks based on said at least one planning and guidance rule, and predicts a decision for each task of said plurality of tasks.

46. The apparatus according to claim 45, wherein said planner module further monitors at least one executed task of said plurality of tasks and updates said decision for said each task of said plurality of tasks remaining to be executed.

47. The apparatus according to claim 46, wherein said planner module further obtains at least one result of said at least one executed task of said plurality of tasks and diagnoses said at least one result.

48. The apparatus according to claim 30, wherein said processing module further comprises:
- a presentation module coupled to each of said scheduler module and said planner module for displaying information to a user; and
- a computation module coupled to each of said presentation module, said scheduler module, and said planner module for performing computations related to said execution of said plurality of tasks.

49. The apparatus according to claim 48, wherein said presentation module further displays a plurality of costs incurred and expected in said execution of each task of said plurality of tasks.

50. The apparatus according to claim 48, wherein said presentation module further displays a plurality of instructions for executing each task of said plurality of tasks.

51. The apparatus according to claim 48, wherein said presentation module further displays results of said plurality of tasks after execution.

52. The apparatus according to claim 48, wherein said computation module further includes a plurality of utilities for manipulating data files within said processing module.

53. The apparatus according to claim 48, wherein said computation module further includes a plurality of utilities for performing said computations.

54. The apparatus according to claim 48, wherein said computation module further includes a plurality of utilities for performing simulations of at least one task of said plurality of tasks within said processing module.

55. The apparatus according to claim 48, wherein said computation module further includes a plurality of utilities for performing data analysis within said processing module.

56. An apparatus for designing a product, said apparatus comprising:
- a template module for storing a plurality of tasks and a plurality of rules for designing said product; and
- a processing module, coupled to said template module and being configured by said plurality of rules, for executing said plurality of tasks;
- said processing module having a scheduler module for monitoring execution of said plurality of tasks, a planner module coupled to said scheduler module for monitoring operation of said scheduler module and said template module, a presentation module coupled to each of said scheduler module and said planner module for displaying information to a user, and a computation module coupled to each of said presentation module, said scheduler module, and said planner module for performing computations related to said execution of said plurality of tasks.

57. A computer readable medium containing executable instructions, which, when executed in a processing system, cause said system to perform a method comprising:
- storing a plurality of tasks and a plurality of rules for designing a product in a template module; and
- executing said plurality of tasks in a processing module coupled to said template module and being configured by said plurality of rules.

58. The computer readable medium according to claim 57, wherein said template module further comprises at least one rule of said plurality of rules for specifying a sequence of execution for said plurality of tasks.

59. The computer readable medium according to claim 57, wherein said template module further comprises at least one rule of said plurality of rules for specifying task information for each task of said plurality of tasks.

60. The computer readable medium according to claim 57, wherein said template module further comprises at least one rule of said plurality of rules for specifying guidance and planning for each task of said plurality of tasks.

61. The computer readable medium according to claim 60, wherein said at least one rule specifying guidance and planning is encoded in a Bayesian Belief Network.

62. The computer readable medium according to claim 57, wherein said template module further comprises at least one rule of said plurality of rules for specifying a start event and an end event for each task of said plurality of tasks.

63. The computer readable medium according to claim 57, wherein said template module further comprises at least one rule of said plurality of rules for managing data within one task of said plurality of tasks.

64. The computer readable medium according to claim 57, wherein said template module further comprises at least one rule of said plurality of rules for allowing interaction with a user and presenting results to said user.

65. The computer readable medium according to claim 57, wherein said template module further comprises at least one rule of said plurality of rules for specifying interaction of each task of said plurality of tasks with said processing module.

66. The computer readable medium according to claim 57, wherein said template module further stores a plurality of task details for each task of said plurality of tasks.

67. The computer readable medium according to claim 57, wherein said template module further stores a plurality of task operations for each task of said plurality of tasks.

68. The computer readable medium according to claim 57, wherein said method further comprises:
- monitoring execution of said plurality of tasks in a scheduler module within said processing module; and
- monitoring operation of said scheduler module and said template module in a planner module coupled to said scheduler module within said processing module.

69. The computer readable medium according to claim 68, wherein said scheduler module further selects a project incorporating said plurality of tasks and monitors said execution of each task of said plurality of tasks.

70. The computer readable medium according to claim 69, wherein, while monitoring, said scheduler module further invokes each task of said plurality of tasks, schedules said each task for said execution, determines completion of said each task, and manages data between consecutive tasks of said plurality of tasks.

71. The computer readable medium according to claim 69, wherein, while selecting, said scheduler module further assigns a set of project parameters to said project, initializes said planner module with a set of planner parameters, and displays said set of project parameters to a user.

72. The computer readable medium according to claim 71, wherein said set of project parameters includes initial project parameters provided by said user.

73. The computer readable medium according to claim 71, wherein said scheduler module further updates said set of planner parameters after completion of said each task of said plurality of tasks.

74. The computer readable medium according to claim 71, wherein said scheduler module further updates said set of project parameters after completion of said each task of said plurality of tasks to obtain a set of updated project parameters, and displays said set of updated project parameters to said user.

75. The computer readable medium according to claim 68, wherein said planner module further loads at least one planning and guidance rule of said plurality of rules from said template module, determines a sequence of execution for said each task of said plurality of tasks based on said at least one planning and guidance rule, and predicts a decision for each task of said plurality of tasks.

76. The computer readable medium according to claim 75, wherein said planner module further monitors at least one executed task of said plurality of tasks and updates said decision for said each task of said plurality of tasks remaining to be executed.

77. The computer readable medium according to claim 76, wherein said planner module further obtains at least one result of said at least one executed task of said plurality of tasks and diagnoses said at least one result.

78. The computer readable medium according to claim 68, wherein said method further comprises:

displaying information to a user by a presentation module coupled to each of said scheduler module and said planner module within said processing module; and performing computations related to said execution of said plurality of tasks by a computation module coupled to each of said presentation module, said scheduler module, and said planner module within said processing module.

79. The computer readable medium according to claim 78, wherein said presentation module further displays a plurality of costs incurred and expected in said execution of each task of said plurality of tasks.

80. The computer readable medium according to claim 78, wherein said presentation module further displays a plurality of instructions for executing each task of said plurality of tasks.

81. The computer readable medium according to claim 78, wherein said presentation module further displays results of said plurality of tasks after execution.

82. The computer readable medium according to claim 78, wherein said computation module further includes a plurality of utilities for manipulating data files within said processing module.

83. The computer readable medium according to claim 78, wherein said computation module further includes a plurality of utilities for performing said computations.

84. The computer readable medium according to claim 78, wherein said computation module further includes a plurality of utilities for performing simulations of at least one task of said plurality of tasks within said processing module.

85. The computer readable medium according to claim 78, wherein said computation module further includes a plurality of utilities for performing data analysis within said processing module.

* * * * *